US005615233A

United States Patent [19]

Baum et al.

[11] Patent Number: 5,615,233
[45] Date of Patent: Mar. 25, 1997

[54] METHOD FOR CHANNEL ESTIMATION USING INDIVIDUAL ADAPTATION

[75] Inventors: Kevin L. Baum, Hoffman Estates; Bruce D. Mueller, Palatine, both of Ill.

[73] Assignee: Motorola, Inc., Schaumburg, Ill.

[21] Appl. No.: 916,757

[22] Filed: Jul. 22, 1992

[51] Int. Cl.$^6$ ............................... H04B 1/04; H03H 7/30
[52] U.S. Cl. ................... 375/350; 375/232; 364/724.2
[58] Field of Search ........................... 375/229, 233, 375/346, 348, 350, 341; 230/235; 333/166; 364/724.2, 724.19, 572; 327/91, 100, 349

[56] References Cited

U.S. PATENT DOCUMENTS

| | | | |
|---|---|---|---|
| 5,099,472 | 3/1992 | Townsend et al. | 370/32.1 |
| 5,175,745 | 12/1992 | Kaku et al. | 375/230 |
| 5,208,837 | 5/1993 | Richey | 375/350 |
| 5,224,127 | 6/1993 | Okanoue | 375/343 |
| 5,230,007 | 7/1993 | Baum | 375/232 |
| 5,233,633 | 8/1993 | Baum et al. | 375/344 |
| 5,276,707 | 1/1994 | Baum | 375/233 |
| 5,304,940 | 4/1994 | Harasawa et al. | 327/552 |
| 5,353,305 | 10/1994 | Fukuda et al. | 375/231 |

FOREIGN PATENT DOCUMENTS

0347394A1  5/1989  Germany .

OTHER PUBLICATIONS

Proakis, John G. and Manolakis, Dimitris G., "Introduction to Digital Signal Processing", New york, Macmillian Publishing Company, 1988, pp. 858–897, ISBN0–02–396810–9.

Primary Examiner—Wellington Chin
Assistant Examiner—William Luther
Attorney, Agent, or Firm—Kenneth W. Bolvin; John J. King

[57] ABSTRACT

The process of the present invention computes the update to the least mean square channel estimator taps. The update coefficient for each tap is computed independently based on the power of each tap relative to the main tap power.

4 Claims, 5 Drawing Sheets

— PRIOR ART —

— PRIOR ART —

5,615,233

METHOD FOR CHANNEL ESTIMATION USING INDIVIDUAL ADAPTATION

FIELD OF THE INVENTION

The present invention relates generally to the field of communications and particularly to digital cellular communications.

BACKGROUND OF THE INVENTION

U.S. digital cellular (USDC) communications uses digitized voice and data signals for communication between a mobile telephone and a base station. These signals are transmitted in the form of short data bursts. When the mobile moves, it may encounter degraded communication channels due to noise and multipath distortion; both noise and distortion varying with time. The multipath distortion is due to a signal being received by the mobile at different times when it bounces off buildings and terrain. Multipath channels can cause intersymbol interference that can be removed with an adaptive equalizer, a specific type of an adaptive filter.

A typical equalizer for USDC uses an adaptive channel estimator. An adaptive channel estimator (ACE) is a linear transversal adaptive filter that attempts to model the impulse response of the communication channel. Since the ACE is a discrete time filter, it accurately attempts to model the sampled impulse response of the communication channel. Typically, the spacing of the channel estimator taps is $T_s$, where $T_s$ is defined to be the inverse of the transmission symbol (baud) rate. This choice of spacing is very useful because it allows the detector to view the entire communication system as a discrete symbol source followed by a finite impulse response (FIR) filter and an additive noise source. This discrete time system model is illustrated in FIG. 1.

The FIR filter is represented by the equation:

$$\underline{H}(n)=\{h_i(n)\}$$

where n denotes time, i denotes the FIR filter coefficient index, and $h_i(n)$ are the tap values of the FIR filter. The reference signal for the ACE, which is illustrated in FIG. 2, is the baseband T-sampled signal at the receiver:

$$y(n) = \sum_k \alpha(k) h_{n-k}(n) + r(n)$$

where $\alpha(n)$ are the training or detected symbols that are input to the ACE from the discrete symbol source and $r(n)$ is the additive noise.

The ACE estimates the (possibly time varying) vector $\underline{H}(n)$, representing the FIR filter coefficients. The ACE uses an adaptive algorithm, such as a recursive least square (RLS) or least mean square (LMS) algorithm, to minimize the mean square error between the reference signal and the ACE output signal, $y(n)$. The ACE output signal, therefore, is ideally equal to the signal at point A in FIG. 1.

In many adaptive filtering problems, the RLS algorithm provides faster convergence and better tracking capability than the LMS process. However, in the case of an adaptive channel estimator, the simpler and more robust LMS process tracks channel variations as well as the RLS process. This is true because the input to the filter is random data symbols that tend to be uncorrelated. The convergence rate of the LMS process is dependent on the autocorrelation of the input signal, and since this correlation is virtually zero, the LMS converges just as rapidly as the RLS process. The configuration of the ACE is illustrated in FIG. 2. The values of the ACE taps are updated by the equation:

$$\underline{H}(n) = \underline{H}(n-1) + \frac{2\mu}{L\sigma^2} e(n)\underline{X}^*(n)$$

where:

$$e(n)=y(n)-\underline{X}^T(n)\underline{H}(n-1)$$

$$\underline{X}^T(n)=[\alpha(n)\alpha(n-1)\ldots\alpha(n-L+1)]$$

$$\underline{H}^T(n)=[h_1(n)h_2(n)\ldots h_L(n)]$$

L=Number of taps in ACE
$\sigma^2$=Variance of $\alpha(n)$
$\mu$=Normalized LMS update coefficient; $0\leq\mu\leq 1$.

Note that in a QPSK type modulation scheme, such as is used in USDC, the variance of $\alpha(n)$ is 1, or can be normalized to a value of 1 because the amplitude of all transmitted symbols is identical.

The ACE used with a maximum likelihood sequence equalizer (MLSE) detector in the USDC receiver has more than one tap ($L\geq 2$). When receiving static or fiat Rayleigh faded signals, only one tap should be non-zero because the signal has not undergone delay spread. The non-zero tap, typically referred to as the main tap, should have a magnitude proportional to the level of the reference signal. In reality, however, noise corrupts the reference signal, and the non-main taps also have some non-zero amplitude. This degrades the output of the channel estimator and causes the MLSE detector to perform poorly compared to a coherent detector in a static or fiat Rayleigh faded channel. There is a resulting need for a method to allow the detector to perform as well as a coherent detector in a fiat, Rayleigh faded channel.

SUMMARY OF THE INVENTION

The process of the present invention encompasses a method for improving channel estimator performance using a plurality of adaptive filters in a time varying environment. Each adaptive filter has a plurality of taps and a reference update coefficient. The process begins by varying the update coefficient of each tap, individually, according to a function of the tap's size and the reference update coefficient. Next, the reference update coefficient is varied in response to the relative performance of at least two of the adaptive filters that have different reference update coefficients.

DETAILED DESCRIPTION OF THE PREFERRED EMBODIMENT

Figure 4:
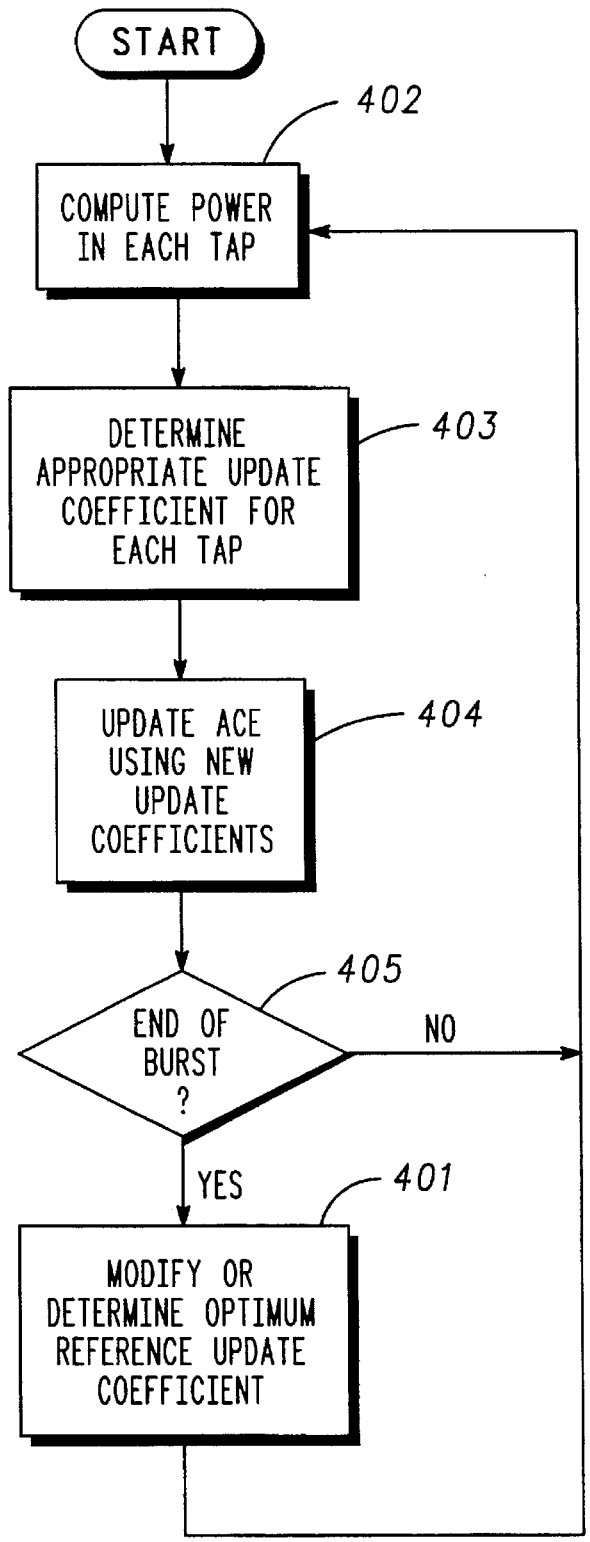
FIG. 4 shows a flowchart of the individual adaptation process of the present invention.

The individual adaptation process of the present invention, illustrated in FIG. 4, enables an MLSE detector to perform similar to a coherent detector in a flat fading channel. The improved performance is achieved by varying the update coefficient for each tap of the adaptive filter according to the power contained in that tap relative to the power contained in the main tap, which is the largest tap.

Figure 5:
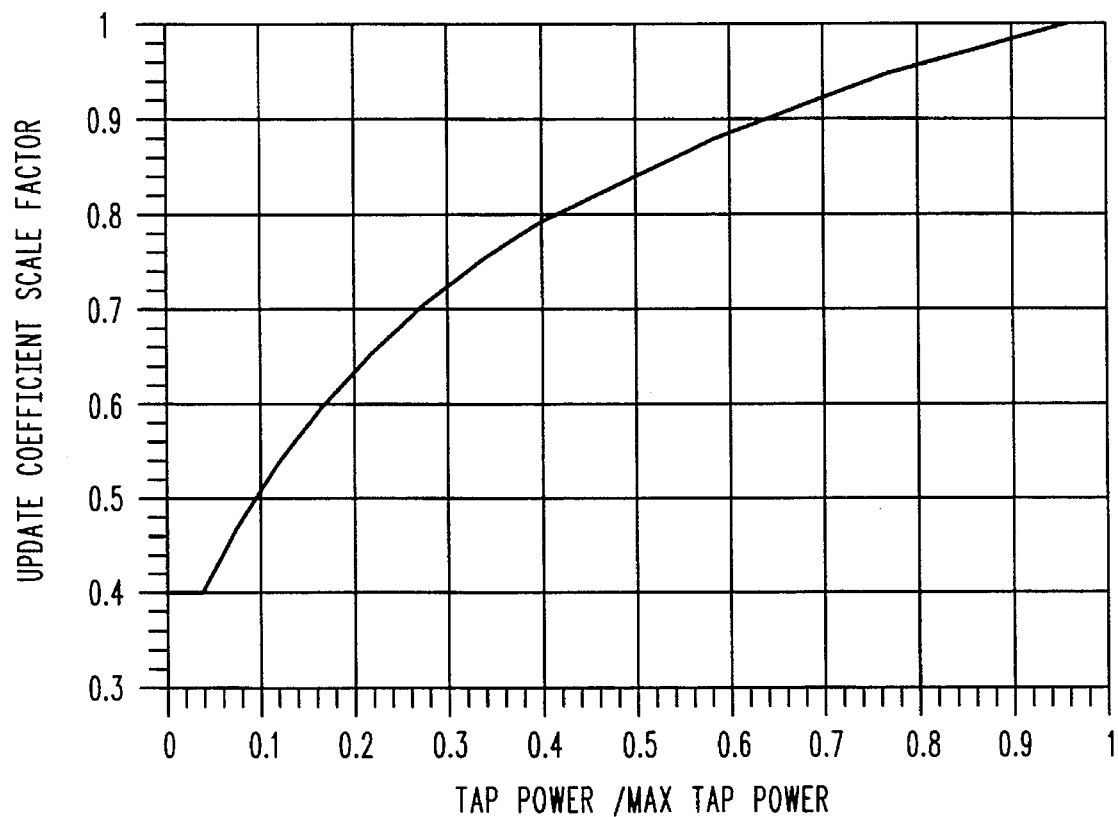
FIG. 5 shows a plot of the update coefficient scale factor function in accordance with the process of the present invention.

The process of the present invention is based on the variation of update coefficient with input signal power. Signals with lower power contain more noise and require a smaller update coefficient for optimal operation. Signals with higher power are optimal at a larger update coefficient since they contain a smaller amount of noise. A curve fit of optimal update coefficients in a fading channel, as illustrated in FIG. 5, suggests the relationship:

Update coefficient≈Power level$^{0.27}$.

This relationship is extended to vary each individual tap with respect to its power level. The update coefficient for each tap is based on the following relationship:

$$\mu_i = \mu_{opt}(\text{Power Level}_i)^{0.27}$$

where:

$\mu_{opt}$=optimal reference update coefficient;
$\mu_i$=update coefficient for the $i^{th}$ tap;
Power Level$_i$=power level of the $i^{th}$ tap.

Referring to FIG. 4, the process begins by computing the size of each tap (402). This can be accomplished in a number of ways; the preferred embodiment uses a relative measure and an alternate embodiment uses an absolute measure.

The relative measure computes a ratio of the absolute measures of two of the taps. In the preferred embodiment, one of these two taps is the tap with the largest absolute measure and the other is the tap currently being updated. To perform the relative measure the power in each tap is computed by adding the square of the tap's real and imaginary parts. This can be illustrated by the following equation:

$$\underline{P}^T(n) = [p1(n) p2(n) \ldots pL(n)],$$

where: $pi(n) = |h_i(n)|^2$ is the power in the $i^{th}$ tap.
The tap found to have the maximum power is divided into each of the tap powers yielding the set of relative power levels:

$$\frac{p_i(n)}{p_{max}(n)}$$

The absolute measure, used in the alternate embodiment, measures each tap's size by the magnitude of the taps. Other ways of performing the absolute measure is by squaring the magnitude of the tap, using the average tap size, or squaring the magnitude of the average tap size.

Whether the relative measure or the absolute measure is used, the results are used by the next step in the process. FIG. 5 illustrates a function that is suitable for determining the relative tap power versus an update coefficient scale factor, Scale Factor$_i$. As indicated previously, the curve is determined by $y = x^{0.27}$ with a floor at $y = 0.4$. The floor was established to prevent the update coefficients from going to zero. This avoids problems where an improper channel estimate yields a tap with a magnitude of zero. The tap is allowed to change because it has a non-zero update coefficient.

Referring again to FIG. 4, the next step of the individual adaptation process of the present invention is to determine the appropriate update coefficients for each tap (403). This is accomplished by the equation:

$$\underline{\mu}^T(n) = [\mu_1(n) \mu_2(n) \ldots \mu_L(n)]$$

where: $\mu_i(n) = \mu_{opt}(\text{Scale Factor}_i)$.

The update for the adaptive filter is now computed (404) by replacing the fixed update coefficient of the prior art equation with the vector $\underline{\mu}(n)$. The identity matrix, I, is included to map the elements of $\underline{\mu}(n)$ to the appropriate tap. The resulting equation is as follows:

$$\underline{H}(n) = \underline{H}(n-1) + \frac{2I\underline{\mu}(n)}{L\sigma^2} e(n)\underline{X}^*(n).$$

Figure 1:
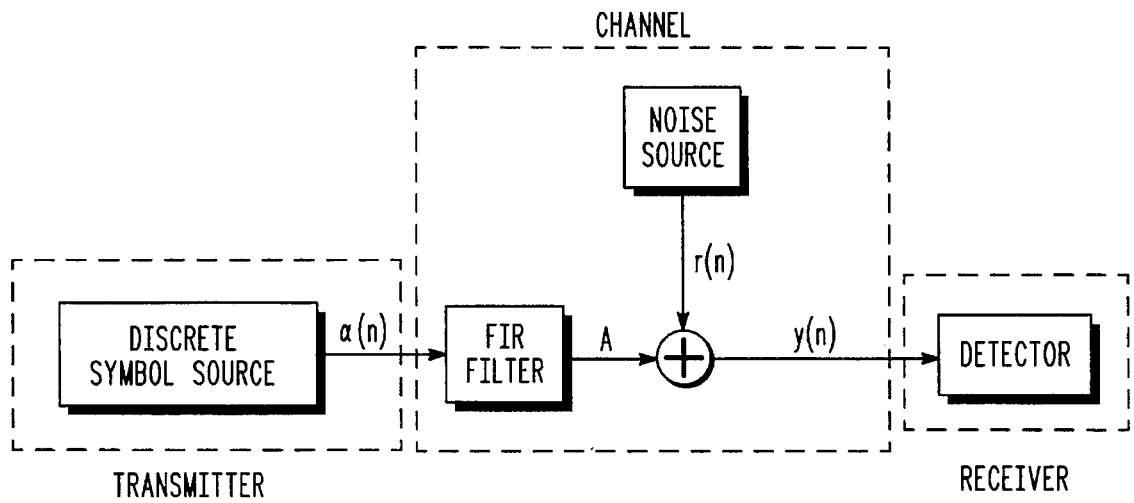
FIG. 1 shows a prior art block diagram of a discrete time system model.
Figure 2:
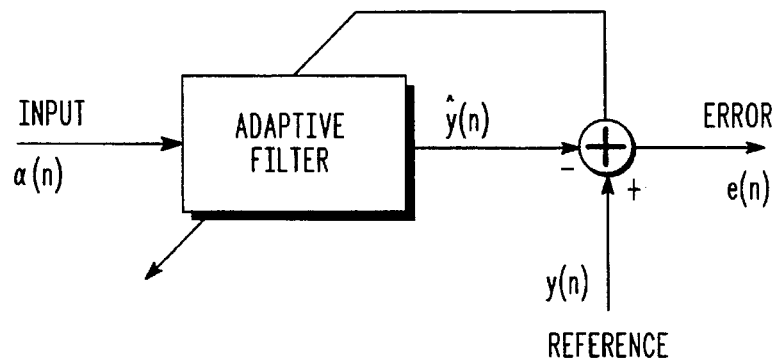
FIG. 2 shows a prior art block diagram of an adaptive channel estimator.
Figure 3:
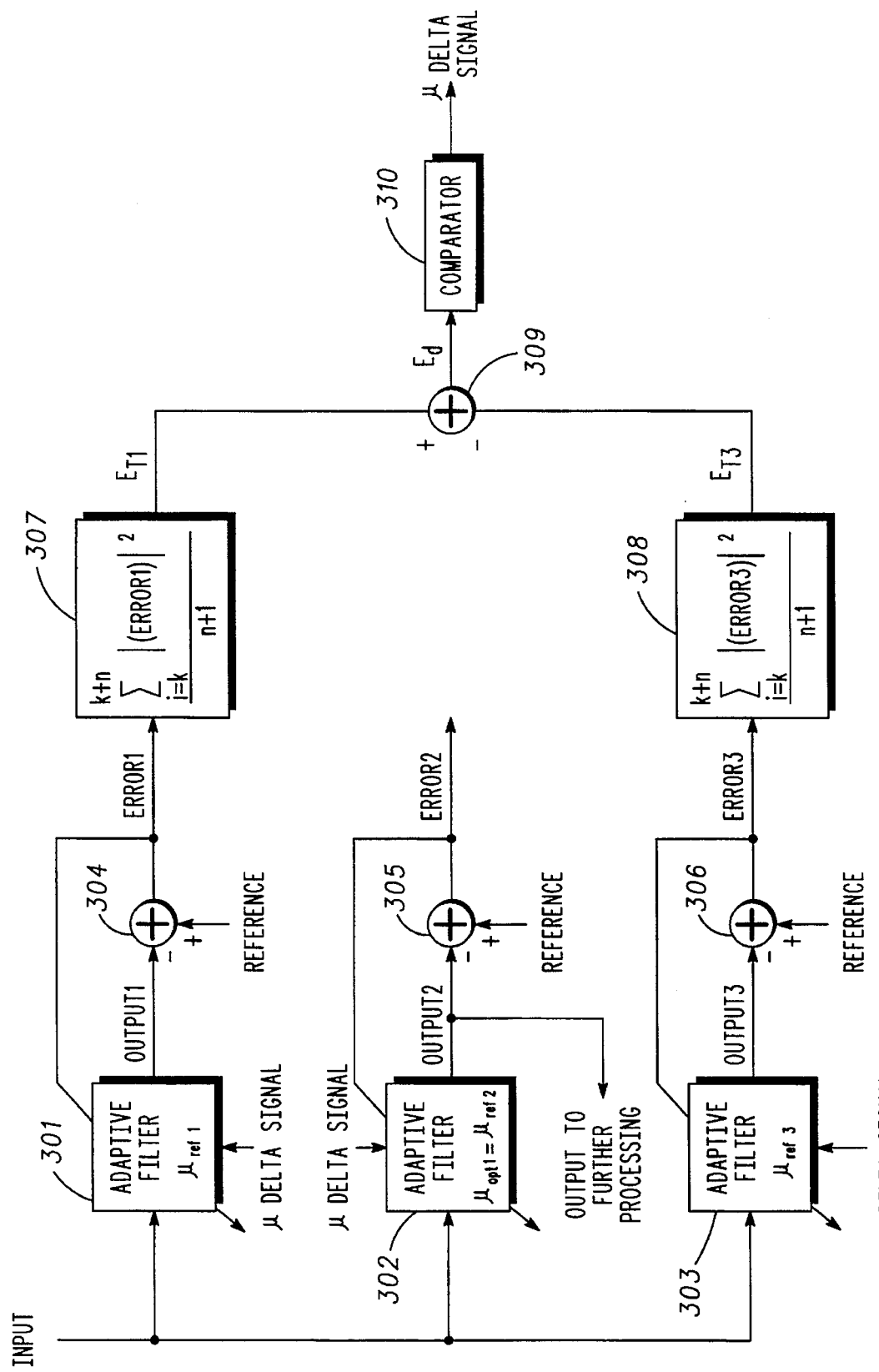
FIG. 3 shows a block diagram of a process to generate an optimum reference update coefficient in accordance with the present invention.

When the end of the current data burst is reached (405), the reference coefficient $\mu_{opt}$ is updated (401) based on the process shown in FIG. 3 and described in copending application Ser. No. 07/722,825 (docket no. CE00473R), having the same assignee as the present invention. This process uses two auxiliary adaptive channel estimators, each with a different reference update coefficient and each using the previously described individual adaptation process, to optimize the reference update coefficient $\mu_{opt}$. The process estimates the mean square error value $E_{T1}$ and $E_{T3}$ of the auxiliary adaptive filters over the data burst. $E_{T3}$ is subtracted (309) from $E_{T1}$ to generate a difference signal, $E_d$. $E_d$ is then used to generate (310) an update signal, $\mu$ delta signal, that is fed back to modify the reference update coefficients.

Figure 6:
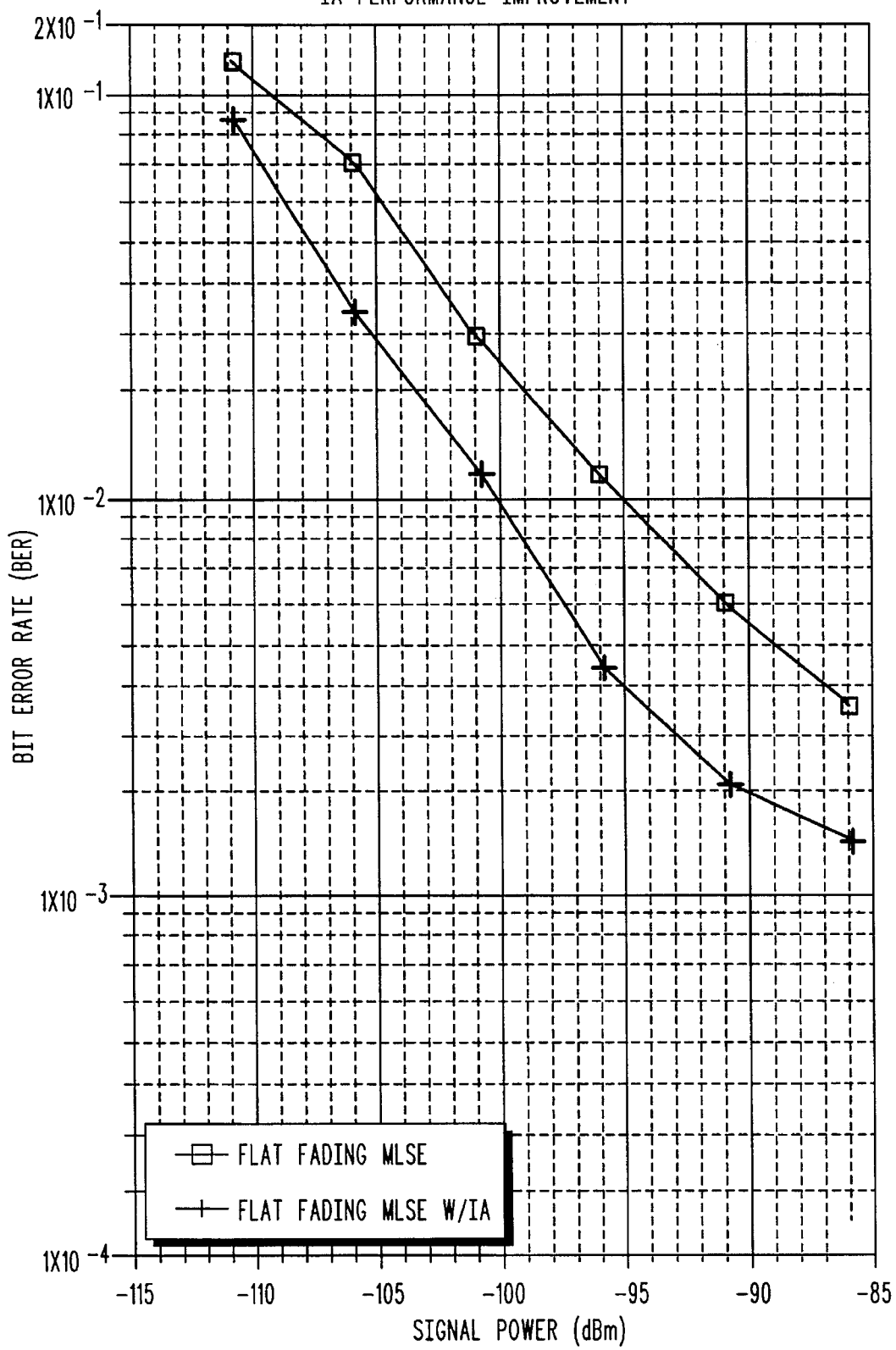
FIG. 6 shows a plot of signal power versus bit error rate in a Rayleigh fading environment, comparing the prior art fixed update coefficient to the individually adapted process of the present invention.

The process of the present invention for channel estimation using individual adaptation of the update coefficients yields significant performance gains. FIG. 6 illustrates this gain by plotting the signal power versus the bit error rate. The upper plot shows flat fading using a fixed update coefficient while the lower plot shows flat fading using the individual adaptation process of the present invention. The lower plot shows a significantly lower bit error rate under the same conditions.

We claim:

1. A method for improving channel estimator performance for an adaptive filter in a time varying environment, the adaptive filter having a reference update coefficient and a plurality of taps, each tap having an update coefficient, the method comprising steps of:

determining an absolute power value for each tap, thus producing a plurality of absolute power values;

determining an independent update coefficient for each tap in response to the plurality of absolute power values; and updating the plurality of taps of the adaptive filter using the independant update coefficient for each tap.

2. A method for improving channel estimator performance for an adaptive filter in a time varying environment, the adaptive filter having a reference update coefficient and a plurality of taps, each tap having an update coefficient, the method comprising steps of:

determining a power value for each tap, thus producing a plurality of power values;

determining a maximum power value from the plurality of power values;

dividing each power value by the maximum power value, thus producing a set of relative power levels;

determining the update coefficient for each tap in response to the set of relative power levels; and updating the plurality of taps of the adaptive filter using the update coefficients for each tap.

3. The method of claim 2 wherein the step of determining a power value for each tap includes squaring real and imaginary parts of each tap and summing these parts of each tap, respectively.

4. The method of claim 2 wherein the step of determining the update coefficient includes multiplying a predetermined scale factor with the reference update coefficient.

* * * * *